(12) United States Patent
Dan et al.

(10) Patent No.: US 11,770,122 B2
(45) Date of Patent: Sep. 26, 2023

(54) CONTROLLER FOR ACTUATING A LOAD AND METHOD FOR OPERATING SUCH A CONTROLLER

(71) Applicant: VITESCO TECHNOLOGIES GMBH, Hannover (DE)

(72) Inventors: Bogdan Dan, Munich (DE); Aurelian Kotlar, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 204 days.

(21) Appl. No.: 17/436,720

(22) PCT Filed: Mar. 4, 2020

(86) PCT No.: PCT/EP2020/055689
§ 371 (c)(1),
(2) Date: Sep. 7, 2021

(87) PCT Pub. No.: WO2020/178334
PCT Pub. Date: Sep. 10, 2020

(65) Prior Publication Data
US 2022/0149831 A1 May 12, 2022

(30) Foreign Application Priority Data
Mar. 6, 2019 (DE) .................. 10 2019 203 085.8

(51) Int. Cl.
*H03K 17/0812* (2006.01)
*H03K 17/082* (2006.01)

(52) U.S. Cl.
CPC ....... *H03K 17/082* (2013.01); *H03K 17/0812* (2013.01); *H02J 2310/50* (2020.01)

(58) Field of Classification Search
CPC .............. H02J 2310/50; H02J 13/0003; H03K 17/082; H03K 17/0812
See application file for complete search history.

(56) References Cited

U.S. PATENT DOCUMENTS 5,670,934 A * 9/1997 Ina ................. B60R 25/04
340/428
5,672,917 A 9/1997 Nakano
(Continued)

FOREIGN PATENT DOCUMENTS

DE 19533968 A1 3/1996
DE 10206222 A1 9/2003
(Continued)

OTHER PUBLICATIONS

Kohama Teruhiko et al, "Simple power line communication using switching converters", Nov. 1, 2015 (Nov. 1, 2015), pp. 1-4, XP032835017, DOI: 10.1109/IFEEC.2015.7361474, [Found on Dec. 18, 2015] Illustrations 1,2,3, Fukuoka University, Japan.
(Continued)

*Primary Examiner* — Harry R Behm
(74) *Attorney, Agent, or Firm* — Laurence A. Greenberg; Werner H. Stemer; Ralph E. Locher

(57) ABSTRACT

A controller for actuating a load includes first and second supply connections. The first supply connection is connected to a high supply voltage potential or the second supply connection is connected to a low supply voltage potential. A controllable switching element is connected between the supply connections. A control unit is connected to the controllable switching element. A control signal transceiver is connected to the first supply connection and to the control unit. A first voltage supply unit is connected to the control signal transceiver. A second voltage supply unit with an energy storage element is connected to the control unit. A coil is connected between the first supply connection and the controllable switching element. A diode is connected to a connection point of the coil and the controllable switching element and to supply connections of the first and second voltage supply units.

13 Claims, 3 Drawing Sheets

(56) References Cited

U.S. PATENT DOCUMENTS

| | | | |
|---|---|---|---|
| 5,727,025 A | 3/1998 | Maryanka | |
| 6,838,783 B2 * | 1/2005 | Stierle | F02D 41/3005 |
| | | | 307/10.1 |
| 7,010,050 B2 | 3/2006 | Maryanka | |
| 8,120,391 B2 | 2/2012 | Bayerer et al. | |
| 8,154,150 B2 | 4/2012 | Sakai et al. | |
| 9,024,579 B2 | 5/2015 | Igata | |
| 9,236,910 B2 | 1/2016 | Eguchi | |
| 10,263,438 B2 * | 4/2019 | Yoon | B60R 16/033 |
| 2008/0164760 A1 * | 7/2008 | Hattori | H02J 9/061 |
| | | | 307/64 |
| 2010/0118983 A1 | 5/2010 | Weber et al. | |
| 2011/0307123 A1 | 12/2011 | Abe et al. | |

FOREIGN PATENT DOCUMENTS

| | | | | |
|---|---|---|---|---|
| DE | 102007002953 A1 | | 7/2008 | |
| DE | 102008049677 A1 | | 6/2010 | |
| DE | 102017202536 A1 * | | 8/2018 | B60R 16/03 |

OTHER PUBLICATIONS

Chai Junwei et al, "Coordinated Power Control for Islanded DC Microgrids Based on Bus-Signaling and Fuzzy Logic Control", 2018 2nd IEEE Conference on Energy Internet and Energy System Integration (EI2), IEEE, Oct. 20, 2018 (Oct. 20, 2018), pp. 1-6, XP033481018, DOI: 10.1109/EI2.2018.8581985, Figure 2.

Maryanka, Yair et al., "The Vehicle Power Line as a Redundant Channel for CAN Communication", Yamar Electronics Ltd., pp. 1-4.

* cited by examiner

CONTROLLER FOR ACTUATING A LOAD AND METHOD FOR OPERATING SUCH A CONTROLLER

FIELD AND BACKGROUND OF THE INVENTION

A large number of controllers for actuating loads based on predefined or determined events are installed in a modern motor vehicle. This can be, for example, an airbag controller which, on the basis of received and processed acceleration signals, generates control signals for a firing pellet for triggering an airbag. However, it can also be an engine controller that generates signals for injection valves and ignition systems based on, for example, crankshaft angle, exhaust gas and other information necessary for controlling a combustion process corresponding to a desired driving behavior.

In a vehicle, however, many other loads such as window lifters or windshield wipers as well as ohmic loads such as lamps or heating elements are switched on and off. For this purpose, the corresponding controllers have electronic switching elements that are controlled via control units, often in the form of microprocessors or state machines.

For these tasks, the controllers usually have two supply lines for connection to an energy source, for example the vehicle battery, but also communication lines, such as a CAN or LIN bus, for communication with other controllers. In addition, it is necessary to provide lines for connection to the corresponding loads. In addition, the controller must have appropriate connections for connection to the lines.

Such controllers are shown and described in DE 10 2007 002 953 A1 and U.S. Pat. No. 5,672,917.

The connections mentioned make the controller more expensive and the lines cause a high weight in the cable harness, require a lot of space and increase the costs.

SUMMARY OF THE INVENTION

It is therefore the object of the invention to specify a less complex and therefore more cost-effective solution.

The object is achieved by means of a controller for actuating a load as described below and a method for operating such a controller as described below. Advantageous developments are specified in the respective subclaims.

According to the invention, a controller for actuating a load is formed, having a first supply connection and a second supply connection, wherein either the first supply connection of the controller is connected to a high supply voltage potential or the second supply connection of the controller is connected to a low supply voltage potential via the load, having a controllable switching element which is connected between the first supply connection and the second supply connection, having a control unit which has a control signal output connected to the control input of the controllable switching element and which has a control signal connection, having a control signal transceiver which is connected by a first connection to the first supply connection and by a second connection to the control signal connection of the control unit and has a control output, having a first voltage supply unit which is connected to the control signal transceiver for the purpose of supplying it with voltage and has a first supply connection and a second supply connection which is connected to the second supply connection of the controller, having a second voltage supply unit which is formed with an energy storage element, is connected to the control unit for the purpose of supplying it with voltage, and has a first supply connection, a second supply connection, which is connected to the second supply connection of the controller, and a control input which is connected to the control output of the control signal transceiver, having a coil which is connected between the first supply connection and the controllable switching element, and having a diode which is connected by its anode to the connection point of the coil and the controllable switching element and by its cathode to the supply connection of the first voltage supply unit and to the supply connection of the second voltage supply unit.

Connecting either the first supply connection of the controller according to the invention to a high supply voltage potential or the second supply connection of the controller to a low supply voltage potential via the load saves a separate ground connection of the controller. In this case, the controller is not continuously connected to the supply voltage, but rather via the switching element, which is controlled with pulse width modulation, and the load. The energy for supplying the controller is provided in the active phases of the load by the energy storage element in the second voltage supply unit, which energy storage element is charged in the switching pauses which must have a minimum duration. In addition, the controller communicates with other controllers that are supplied by the same voltage supply source via the supply lines by means of the control signal transceiver. Special communication lines are therefore also saved.

In a development of the controller according to the invention, a further diode is provided and is connected by its cathode to the first supply connection of the controller and by its anode to the connection point of the coil and the controllable switching element.

This further diode is used to clamp voltage spikes that occur on the coil when the switching element is opened, in order to protect the switching element from overvoltage.

A further development of the controller according to the invention has a bandpass filter which is arranged between the first supply connection of the controller and the first connection of the control signal transceiver.

This filters out interfering signals when transmitting information.

In an advantageous embodiment of the controller according to the invention, the second voltage supply unit has a further output which is connected to a first control input of the control unit for the purpose of transmitting information relating to the state of charge of the energy storage element.

It is thus possible to configure the pulse width ratio when controlling the load not only according to the load conditions but also according to the state of charge of the energy storage element, since longer pulse pauses are required when the charge of the energy storage element is low in order to be able to maintain a supply to the controller during the active phases of the load.

In a further advantageous embodiment of the controller according to the invention, a current measuring device is arranged between the controllable switching element and the second supply connection and is connected to a second control input of the control unit.

This makes it possible to detect overcurrents and to initiate suitable measures, for example disconnection of the load.

In an advantageous development of the controller, the control unit has a control output which is connected to the control input of the second voltage supply unit via an OR gate, via which the control output of the control signal transceiver is also connected to the control input of the second voltage supply unit.

Thus, after the controller has been woken up, the control unit maintains the operation of the second voltage supply unit.

The object is also achieved by means of a method for operating a controller according to the invention, in which, depending on signals received by means of the control signal transceiver, the controllable switching element is controlled with pulse width modulation via the control unit, wherein the energy storage element is charged in the pauses between two pulses.

This makes it possible in accordance with the invention to connect the controller in series with the load to a supply voltage source, for example a vehicle battery, wherein the charging current for the energy storage element likewise flows via the load in the pulse pauses.

In a development of the method according to the invention, signals for the control signal transceiver can be received at times when the controllable switching element is not controlled to close.

BRIEF DESCRIPTION OF THE FIGURES

The invention is explained in more detail below on the basis of exemplary embodiments and with the aid of figures.

DETAILED DESCRIPTION OF THE INVENTION

Figure 1:
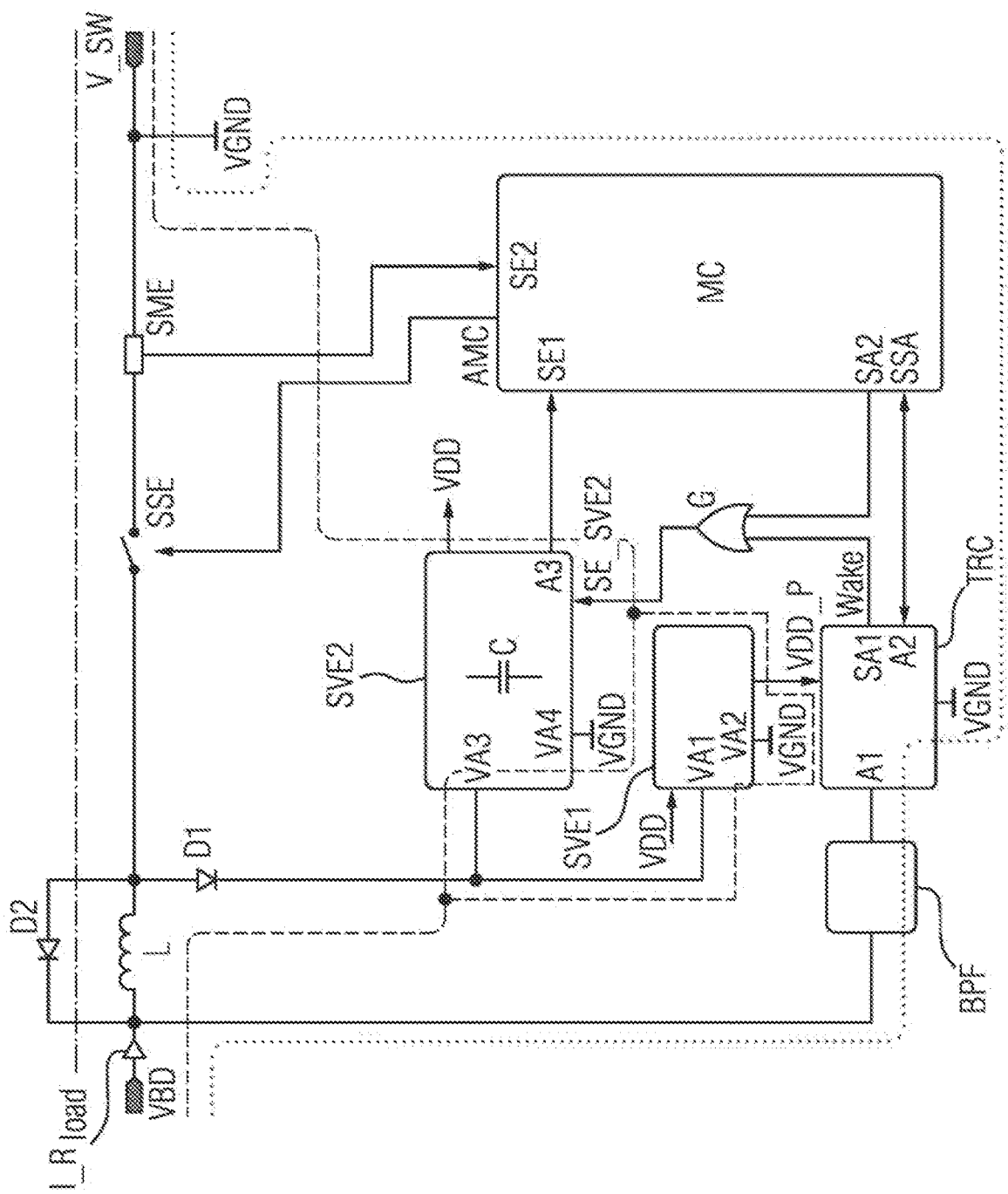
FIG. 1 shows a circuit example for a controller according to the invention.

FIG. 1 shows a controller 1 according to the invention which has a first supply connection VBD and a second supply connection V_SW. The two connections are connected to one another within the controller via a coil L, a controllable switching element SSE and a current measuring device SME. In the illustrated exemplary embodiment of a controller according to the invention, the first supply connection is intended to be connected directly to a positive potential of an energy source, for example a vehicle battery, while the second supply connection V_SW is intended to be connected to the low potential of the energy source via a load (not illustrated in FIG. 1, $R_{load}$ in FIG. 3). In this case, the second supply connection V_SW represents a virtual ground VGND for the controller 1 or the electronic circuits formed therein.

The controller 1 has a control signal transceiver TRC which has a first connection A1, a second connection A2 and a control output SA1. It is also connected to the virtual ground VGND and is supplied with a supply voltage from a first voltage supply unit SVE1. The first connection A1 of the control signal transceiver TRC is connected to the first supply connection VBD of the controller 1 via a bandpass filter BPF.

The controller 1 also has a control unit MC which may be in the form of a microcomputer, in particular, and has a control signal connection SSA which is connected to the second connection A2 of the control signal transceiver TRC, in order to be able to interchange data with it. The control unit MC also has a control signal output AMC which is connected to the control connection of the controllable switching element SSE. The controllable switching element SSE may be in the form of a MOSFET or IGBT, for example. The control unit MC also has a first control input SE1 and a second control input SE2, wherein the second control input SE2 is connected to the current measuring device SME.

The first voltage supply device SVE1 has a first supply connection VA1 which is connected to the connection point of the coil L and the controllable switching element SSE via a diode D1. The first voltage supply unit SVE1 also has a second supply connection VA2 which is connected to the virtual ground VGND. It is also supplied with a supply voltage VDD which is supplied by a second voltage supply unit SVE2. This supply voltage VDD is also applied to the control unit MC which is also likewise connected to the virtual ground VGND.

The second voltage supply unit SVE2 has a first supply connection VA3 and a second supply connection VA4. It also has a control input SE_SVE2 and a further output A3. The further output A3 is connected to the first control input SE1 of the control unit MC, while the control input SE_SVE2 is connected to the output of an OR gate G, the two inputs of which are connected to the control output SA1 of the signal transceiver TRC and to the second control output SA2 of the control unit MC. The second supply connection VA4 of the second voltage supply device SVE 2 is connected to the virtual ground VGND, while the first supply connection VA3 is also connected to the cathode of the diode D1.

A further diode D2 is connected in parallel with the coil L, wherein the cathode of said diode is connected to the first supply connection VBD of the controller 1. This further diode D2 serves as a freewheel for the coil L when the switching element SSE opens and would interrupt the current flow through the coil L.

The controller 1 in FIG. 1 is operated as follows. First of all, the controllable switching element SSE is open, with the result that no large current can flow via a load ($R_{load}$, see FIG. 3) connected to the second supply connection V_SW of the controller 1. Only a current flows via the coil L and the diode D1 to the first voltage supply unit SVE1 and from there via the second supply connection V_SW via the load to the low potential of an energy supply source. This is indicated by a dashed line in FIG. 1. The first voltage supply unit SVE1 supplies the signal transceiver TRC and also enables operation of the OR gate G.

If information is transmitted via the first supply connection VBD of the controller 1, that is to say via the supply line, this information is received by the signal transceiver TRC and wakes it up from a sleep mode. This is indicated by a dotted line. A wake-up signal is output at the control output SA1 of the control signal transceiver TRC and applied to the second control input SE SVE2 of the second voltage supply unit SVE2 via the OR gate G. As a result, the entire controller 1 is activated and starts working.

The control unit MC now takes over the control of the second voltage supply unit SVE2 via its control output SA2 and the OR gate G, with the result that the second voltage supply unit SVE 2 remains active regardless of the signal state at the signal output SA1 of the control signal transceiver TRC.

Next, it is assumed that the controller 1 receives a message about a pulse width for the pulse-width-modulated operation of the load. In this case, the pulse width ratio can be between 0% (inactive load) and a predefined maximum ratio which may never be 100%, but can be in the range from 90 to 95%. This received pulse width ratio is used to cyclically control the controllable switching element SSE in order to supply the load with a corresponding predefined mean voltage. The switching frequency is preferably fixed.

If the pulse width ratio is greater than 0%, the control unit MC will control the controllable switching element SSE with this pulse width ratio during the predefined duration received via the control signal transceiver TRC in order to operate the load. The load current flows in this case from the first supply connection VBD of the controller 1 via the coil L, the controllable switching element SSE, the current measuring device SME via the second supply connection V_SW and the load. This is indicated by a dash-dotted line.

During this time, while the controllable switching element SSE is switched on, the voltage drop between the anode of the diode D1 and the virtual ground VGND is low, with the result that the second voltage supply unit SVE2 is not sufficiently supplied and the storage capacitor C formed therein is thus only charged insignificantly. Instead, the further circuit components of the controller 1 are supplied from this capacitor C.

The current measuring device SME is used to detect overcurrent situations so that, in the event of danger, the control unit MC can switch off the controllable switching element SSE in order to protect the controller 1.

After the duration of operation of the load, which is predefined via the pulse width ratio, has expired during a period, the control unit MC switches off the controllable switching element SSE. During this switched-off time, the capacitor C in the second voltage supply unit SVE2 is charged via the coil L and the diode D1. This charging requirement limits the maximum predefinable pulse width ratio. During this time, while the controllable switching element SSE is switched off, the control signal transceiver TRC interchanges information with other controllers connected to the supply lines. In general, the duration of communication time slots KZS is much shorter than the period of time that is required to charge the capacitor C in the second voltage supply unit 2.

Figure 2:
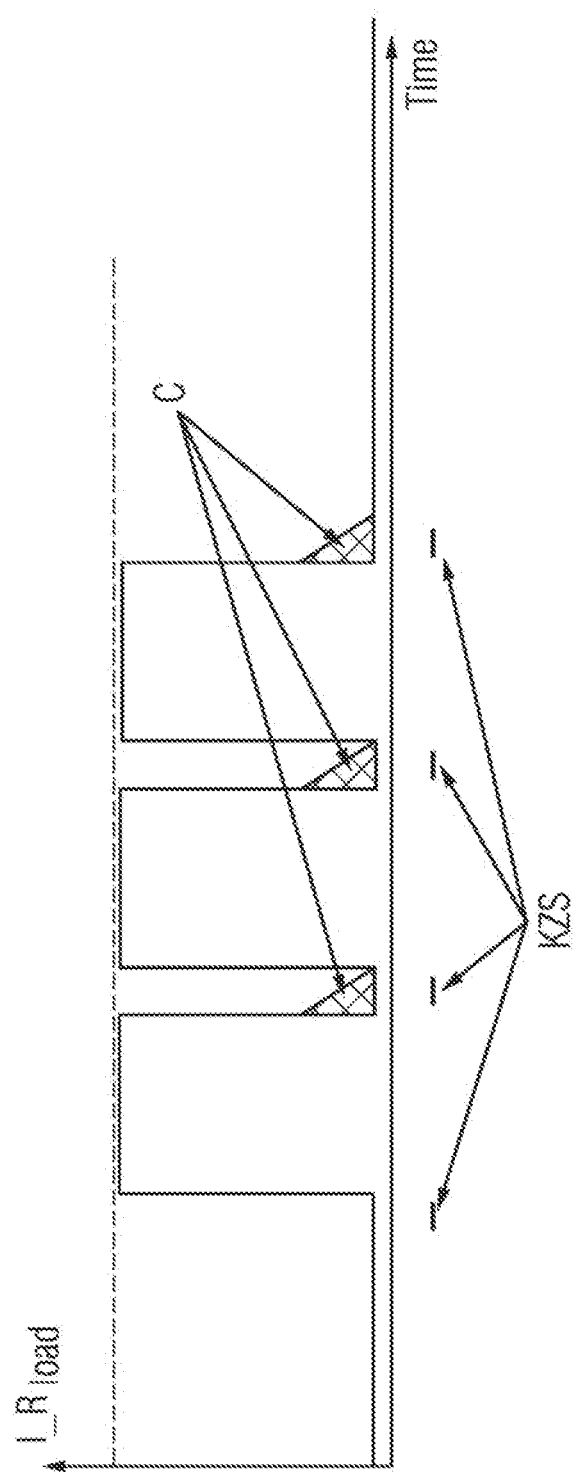
FIG. 2 shows a current curve for the input current of a controller according to the invention.

In FIG. 2, the current $I\_R_{load}$ which flows into the controller 1 at the first supply input VBD is shown over time. At the times when the load current $I\_R_{load}$ assumes a high value, the load is operated, and, in the pauses in between, a lower load current $I\_R_{load}$ can be seen, which slowly decreases as the charge on the capacitor C increases. Outside the time periods in which the load is operated, communication time slots KZS are indicated in which the controller 1 usually communicates by means of the control signal transceiver TRC with other controllers connected to the supply line of a battery B. However, said communication can also take place during the operation of the load if the dimensioning of the coil L allows this.

Figure 3:
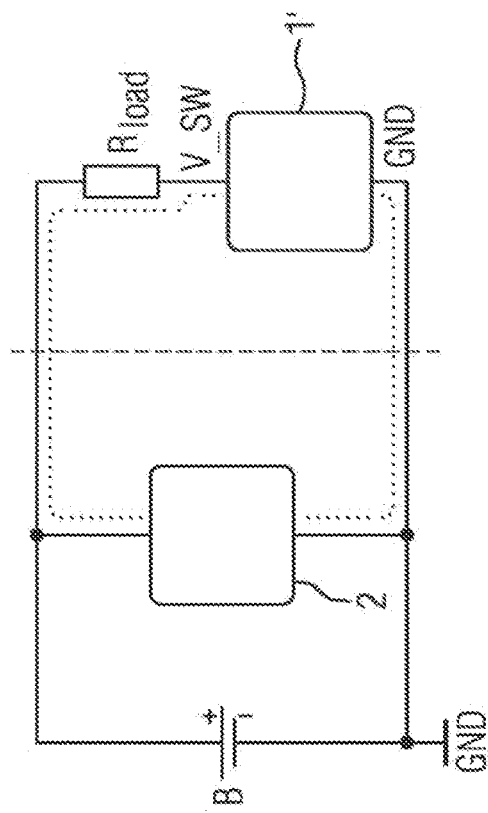
FIG. 3 shows a first possible way of operating a controller according to the invention.

A first possible arrangement of a controller 1 according to the invention in a supply network is shown schematically in FIG. 3. Here, a controller 1 according to FIG. 1 is connected by its first supply connection VBD directly to the high potential of a battery B, while the second supply connection V_SW is connected via a load $R_{load}$ to the low potential, or the ground potential GND, of the battery B. A second controller 2 is shown, which is also supplied by the battery B and, as indicated by a dotted line, communicates with the controller 1 via the supply lines.

Figure 4:
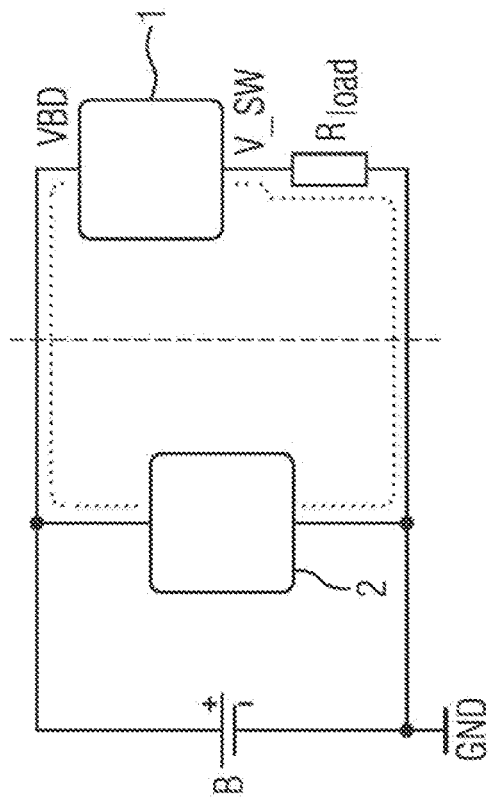
FIG. 4 shows a second possible way of operating a controller according to the invention.

FIG. 4 shows a second variant of a possible connection of a controller 1' according to the invention, in which the second supply connection of the controller 1' is connected to the low potential GND of the battery B, while the first supply connection V_SW is connected via a load $R_{load}$ to the high potential of the battery B. For this purpose, it is possible to use a controller according to FIG. 1, in which the first supply connection is denoted V_SW and the second supply connection is denoted GND.

The second voltage supply unit SVE2 may be in the form of a linear regulator, for example, in which the capacitor C is arranged at its output or can also be formed, for example, with a boost converter followed by a buck converter, between which the capacitor C is arranged. In the further case, the value of the capacitor C can be greatly reduced, since the higher voltage generated by the boost converter enables a higher energy content with a lower capacitance.

In this way, the controller 1 can be operated with any number of switched-on phases of the load until a movement message is received via the control signal transceiver TRC, or if no further communication takes place after a predefined period of time. As a result, the controller 1 will go into the sleep mode until a new wake-up signal is received from the control signal transceiver TRC via the supply lines.

The coil L serves to eliminate capacitive effects of the controllable switching element SSE in the switched-off state above certain frequencies in which the communication frequency band of the control signal transceiver is located. The coil L should have a low non-reactive resistance in order to reduce power losses during the switched-on times. The further diode D2 connected in parallel with the coil L is used to limit voltage spikes that arise at the coil when the controllable switching element SSE is opened, in order to protect the controllable switching element SSE from overvoltages.

The control signal transceiver TRC can permanently interchange messages with other controllers without having to pay attention to switched-off periods of the controllable switching element SSE if the coil L can be large enough. In this case, the coil L must represent a high impedance for the control signal transceiver TRC, even when the controllable switching element SSE is switched on. This is only possible if no adverse effects on the non-reactive resistance of the coil L are to be accepted while the controllable switching element SSE is switched on.

The load resistance $R_{load}$ must have a sufficiently low impedance in the communication frequency band of the control signal transceiver TRC so that the communication signals are not attenuated. This is usually fulfilled by a purely ohmic load.

The characteristics of the supply lines in the system and those of the control signal transceiver TRC must be selected in such a way that they enable reliable communication with other controllers in all operating conditions.

The characteristics of the control signal transceiver must be selected in such a way that they enable a reliable system function and impair system components and nearby components in connection with EMC standards.

The invention claimed is:

1. A controller for actuating a load, the controller comprising:
   a first supply connection and a second supply connection;
   said first supply connection of said controller being connected to a high supply voltage potential or said second supply connection of said controller being connected to a low supply voltage potential via the load;
   a controllable switching element connected between said first supply connection and said second supply connection, said controllable switching element having a control input;

a control unit having a control signal output connected to said control input of said controllable switching element, said control unit having a control signal connection;

a control signal transceiver having a first connection connected to said first supply connection and a second connection connected to said control signal connection of said control unit, said control signal transceiver having a control output;

a first voltage supply unit connected to said control signal transceiver for supplying said control signal transceiver with voltage, said first voltage supply unit having a first supply connection and a second supply connection connected to said second supply connection of the controller;

a second voltage supply unit formed with an energy storage element, said second voltage supply unit being connected to said control unit for supplying said control unit with voltage, said second voltage supply unit having a first supply connection, a second supply connection connected to said second supply connection of the controller, and a control input connected to said control output of said control signal transceiver;

a coil connected between said first supply connection and said controllable switching element, said coil being connected to said controllable switching element at a connection point; and a diode having an anode connected to said connection point of said coil and said controllable switching element and having a cathode connected to said first supply connection of said first voltage supply unit and to said first supply connection of said second voltage supply unit.

2. The controller according to claim 1, which further comprises a further diode having a cathode connected to said first supply connection of the controller and an anode connected to said connection point of said coil and said controllable switching element.

3. The controller according to claim 1, which further comprises a bandpass filter disposed between said first supply connection of the controller and said first connection of said control signal transceiver.

4. The controller according to claim 1, wherein said control unit has a first control input, and said second voltage supply unit has a further output connected to said first control input of said control unit for transmitting information relating to a state of charge of said energy storage element.

5. The controller according to claim 4, wherein said control unit has a second control input, a current measuring device is disposed between said controllable switching element and said second supply connection, and said current measuring device is connected to said second control input of said control unit.

6. The controller according to claim 1, which further comprises:
an OR gate;
said control unit having a control output connected to said control input of said second voltage supply unit through said OR gate; and
said control output of said control signal transceiver also being connected to said control input of said second voltage supply unit through said OR gate.

7. A circuit arrangement, comprising:
a load;
a power supply; and
a controller according to claim 6, said controller being connected to said load and to said power supply.

8. The circuit arrangement according to claim 7, which further comprises a further diode having a cathode connected to said first supply connection of the controller and an anode connected to said connection point of said coil and said controllable switching element.

9. The circuit arrangement according to claim 7, which further comprises a bandpass filter disposed between said first supply connection of the controller and said first connection of said control signal transceiver.

10. The circuit arrangement according to claim 7, wherein said control unit has a first control input, and said second voltage supply unit has a further output connected to said first control input of said control unit for transmitting information relating to a state of charge of said energy storage element.

11. The circuit arrangement according to claim 10, wherein said control unit has a second control input, a current measuring device is disposed between said controllable switching element and said second supply connection, and said current measuring device is connected to said second control input of said control unit.

12. A method for operating a controller, the method comprising:
providing a controller according to claim 1;
using said control unit to control said controllable switching element with pulse width modulation, depending on signals received by said control signal transceiver; and
charging said energy storage element in pauses between two pulses.

13. The method according to claim 12, which further comprises receiving signals for said control signal transceiver at times when said controllable switching element is not controlled to close.

* * * * *